(12) United States Patent
Chang et al.

(10) Patent No.: US 9,859,313 B2
(45) Date of Patent: Jan. 2, 2018

(54) COMPLEMENTARY METAL-OXIDE-SEMICONDUCTOR DEPTH SENSOR ELEMENT

(71) Applicant: EMINENT ELECTRONIC TECHNOLOGY CORP. LTD., Hsinchu (TW)

(72) Inventors: Tom Chang, Taipei (TW); Kao-Pin Wu, New Taipei (TW)

(73) Assignee: EMINENT ELECTRONIC TECHNOLOGY CORP. LTD., Hsinchu (TW)

( * ) Notice: Subject to any disclaimer, the term of this patent is extended or adjusted under 35 U.S.C. 154(b) by 53 days.

(21) Appl. No.: 15/193,496

(22) Filed: Jun. 27, 2016

(65) Prior Publication Data

US 2017/0074643 A1  Mar. 16, 2017

Related U.S. Application Data

(60) Provisional application No. 62/216,370, filed on Sep. 10, 2015.

(30) Foreign Application Priority Data

Mar. 1, 2016 (TW) .............................. 105106092 A (51) Int. Cl.
  *H01L 27/146* (2006.01)
  *H01L 31/02* (2006.01)
(52) U.S. Cl.
  CPC .. *H01L 27/14607* (2013.01); *H01L 27/14614* (2013.01); *H01L 31/02* (2013.01)

(58) Field of Classification Search
  CPC ......... H01L 27/14614; H01L 27/14607; H01L 31/02
  USPC ...................................... 250/559, 19, 559.21
  See application file for complete search history.

(56) References Cited

U.S. PATENT DOCUMENTS 7,352,454 B2 *  4/2008  Bamji ................... G01S 7/4816
                                                        257/414
7,626,685 B2 * 12/2009  Jin ............................ G01C 3/08
                                                        257/290

FOREIGN PATENT DOCUMENTS

TW        200616218 A1    5/2006

* cited by examiner

*Primary Examiner* — Seung C Sohn
(74) *Attorney, Agent, or Firm* — patenttm.us (57) ABSTRACT

A complementary metal-oxide-semiconductor depth sensor element comprises a photogate formed in a photosensitive area on a substrate. A first transfer gate and a second transfer gate are formed respectively on two sides of the photogate in intervals. A first floating doped area and a second floating doped area are formed respectively on the outer sides of the first transfer gate and the second transfer gate. The first and second floating doped regions have dopants of a first polarity and the semiconductor area has dopants of a second polarity opposite to the first polarity. Since the photogate and at least parts of the first and second transfer gates connect to the same semiconductor area and no other dopants of polarity opposite to the second polarity. Therefore, the majority carriers from the photogate excited by lights drift, but not diffuse, to transfer to the first and second transfer gates.

19 Claims, 10 Drawing Sheets

COMPLEMENTARY METAL-OXIDE-SEMICONDUCTOR DEPTH SENSOR ELEMENT

CROSS-REFERENCE TO RELATED APPLICATIONS

This application claims the benefit of U.S. provisional application filed on Sep. 10, 2015 and having application Ser. No. 62/216,370, the entire contents of which are hereby incorporated herein by reference This application is based upon and claims priority under 35 U.S.C. 119 from Taiwan Patent Application No. 105106092 filed on Mar. 1, 2016, which is hereby specifically incorporated herein by this reference thereto.

BACKGROUND OF THE INVENTION

1. Field of the Invention

The present invention relates to a depth sensor element, especially to a complementary metal-oxide-semiconductor (CMOS) depth sensor element.

2. Description of the Prior Arts

Figure 6:
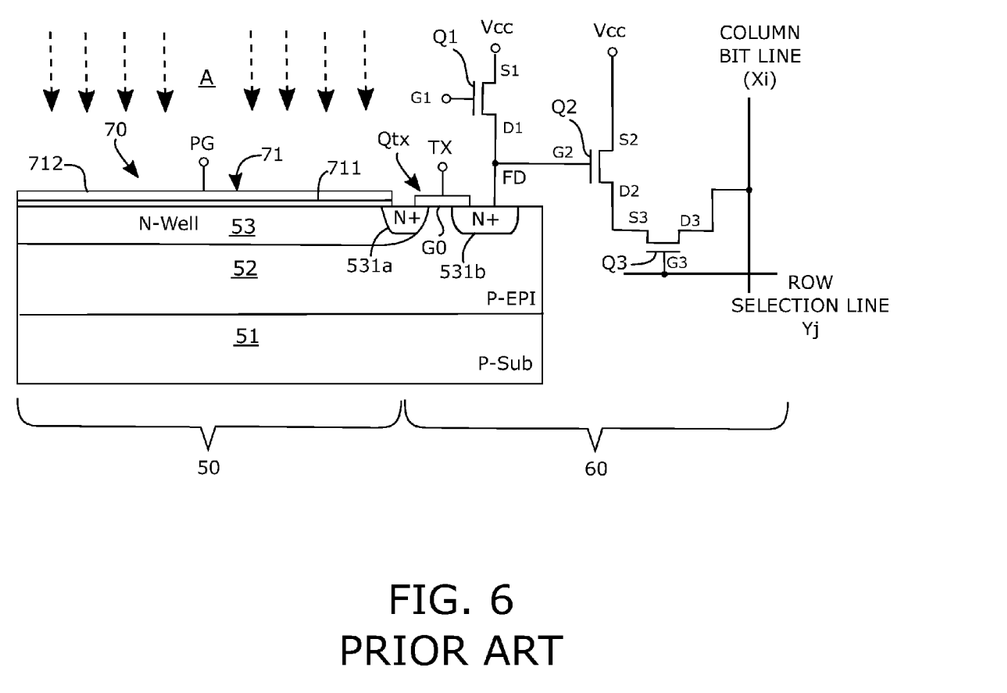
FIG. 6 is a side view in partial section of a conventional CMOS depth sensor element in accordance with the prior art.

A conventional CMOS depth sensor element of an active image sensor as shown in FIG. 6 comprises a sensing element 50 and a reading unit 60. The sensing unit 50 comprises a photogate element 70. The reading unit 60 comprises a transfer transistor Qtx, a reset transistor Q1, an amplifier transistor Q2 and a selection transistor Q3. The photogate element 70 shown in FIG. 6 is a n-type photogate element. A p-type epitaxy 52 is formed on a p-type substrate 51. Then a n-type doped well 53 is formed on the p-type epitaxy 52 corresponding to a photosensitive region A. Then a photogate 71 is formed on the n-type doped well 53. The photogate 71 comprises an insulating layer 711 and a poly-silicon layer 712.

The transfer transistor Qtx is a n-type complementary metal-oxide-semiconductor (NMOS) transistor. The transfer gate G0 of the transfer transistor Qtx is formed on the p-type epitaxy 52 of the p-type substrate 51. The a first $n^+$ doped region 531 a and a second $n^+$ doped region 53 1b are formed in the p-type epitaxy 52 and respectively correspond to under two sides of the transfer gate G0. The first $n^+$ doped region 531a is formed on one side of the n-type doped well 53. The transfer gate G0 of the transfer transistor Qtx and the photogate 71 of the photogate element are conductively connected to each other at the bottom. The second n+ doped region 531b functions as a transmitting node FD of the conventional depth sensor element and is conductively connected to the reset transistor Q1 and the amplifier transistor Q2.

The reset transistor Q1, the amplifier transistor Q2 and the selection transistor Q3 as shown in FIG. 6 are all NMOS transistors and are represented in electronic element symbol. The source S1 of the reset transistor Q1 is connected to the transmitting node FD. The drain D1 of the reset transistor Q1 is connected to a high potential voltage Vcc. The gate G2 of the amplifier transistor Q2 is also connected to the transmitting node FD. The drain D2 of the amplifier transistor Q2 is also connected to the high potential voltage Vcc. The source S2 of the amplifier transistor Q2 is connected to the drain D3 of the selection transistor Q3. The gate G3 of the selection transistor Q3 is connected to a corresponding one of the row selection line Yj of the image sensor. The source S3 of the selection transistor Q3 is connected to a corresponding one of the column bit line Xi.

When light is emitted to the photosensitive region A, the photogate element 70 is excited to generate majority carriers. For example, for the n-type photogate element 70, the majority carriers are electrons. Then a driving signal TX is output to the transfer gate G0 of the transfer transistor Qtx for generating a channel between the first and second $n^+$ doped region 531a, 531b. The majority carriers generated from the photogate element 70 excited by light diffuse to the first $n^+$ doped region 531a and then moves to the second $n^+$ doped region 531b through the channel. Therefore, the majority carriers are collected in the transmitting node FD. Then, the reset transistor Q1 and the amplifier transistor Q2 are controlled to amplify a sensing signal corresponding to the majority carriers of the transmitting node FD. When a selection signal is transmitted to the row selection line Yj connecting to the gate G3 of the selection transistor Q3, the selection transistor Q3 is switched on to transmit the amplified sensing signal to the corresponding column bit line Xi.

In conclusion, when the channel of the transfer transistor Qtx is generated, the majority carriers generated from the photogate element 70 excited by light are collected to the transmitting node FD. However, a PN junction is between the first $n^+$ doped region 531a and the p-type epitaxy 52 so that a gate voltage must be large enough to generate the channel for transferring the majority carriers of the photogate element 70 when the transfer transistor Qtx is switched on. Further, the majority carriers are transferred to the first $n^+$ doped region 531a by diffusion so that the transferring speed of the majority carriers are slow. Therefore, the semiconductor structure of the conventional depth sensor element is against the development of the image sensor with high speed and needs to be further improved.

SUMMARY OF THE INVENTION

Because the conventional depth sensor element can not satisfy the demand of high speed, the main objective of the present invention is to provide a CMOS depth sensor element to provide quicker sensing responding speed.

The depth sensor element comprises:
a substrate comprising a photosensitive region;
a semiconductor region formed on the substrate;
a photogate formed on the semiconductor region, corresponding to the photosensitive region and having a first side and a second side;
a first transfer gate formed on the semiconductor region and having
a first side; and
a second side adjacent to the first side of the photogate;
a first gap formed between the second side of the first transfer gate and the first side of the photogate;
a second transfer gate formed on the semiconductor region and having
a first side adjacent to the second side of the photogate; and
a second side;
a second gap formed between the first side of the second transfer gate and the second side of the photogate;
a first floating doped region formed in the semiconductor region, connected to the first side of the first transfer gate and being as a first transmitting node; and
a second floating doped region formed in the semiconductor region, connected to the second side of the second transfer gate and being as a second transmitting node;
wherein the photogate, at least a part of the first transfer gate, at least a part of the second transfer gate connect to the same semiconductor region, and the first and second floating doped regions have dopants of a first polarity and the semiconductor region has dopants of a second polarity opposite to the first polarity.

With the aforementioned semiconductor structure of the CMOS depth sensor element, the first and second flowing doped regions are used as transmitting nodes, and the photogate and at least parts of the first and the second transfer gates connect to the same semiconductor regions, and the polarities of the dopants of the semiconductor region and the first and second floating doped regions are different. Therefore, the CMOS depth sensor element of the present invention does not comprise the first doped region of the transfer transistor of the conventional CMOS depth sensor element. Thus, when the first or second transfer gates are supplied the driving signals to read the sensing signals of the CMOS depth sensor element of the present invention, an electric field is established between the photogate and the first or second transfer gates supplied the driving signals to result in a fringing electric field effect. Then the majority carriers from the photogate element excited by lights drift to the first or second floating doped regions to speed up the output speed of the sensing signals.

DETAILED DESCRIPTION OF THE EMBODIMENTS

Figure 1A:
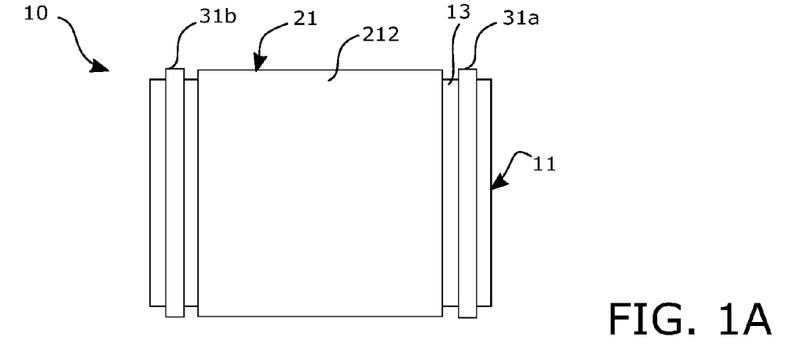
FIG. 1A is a top view of a first embodiment of a CMOS depth sensor element in accordance with the present invention.
Figure 2A:
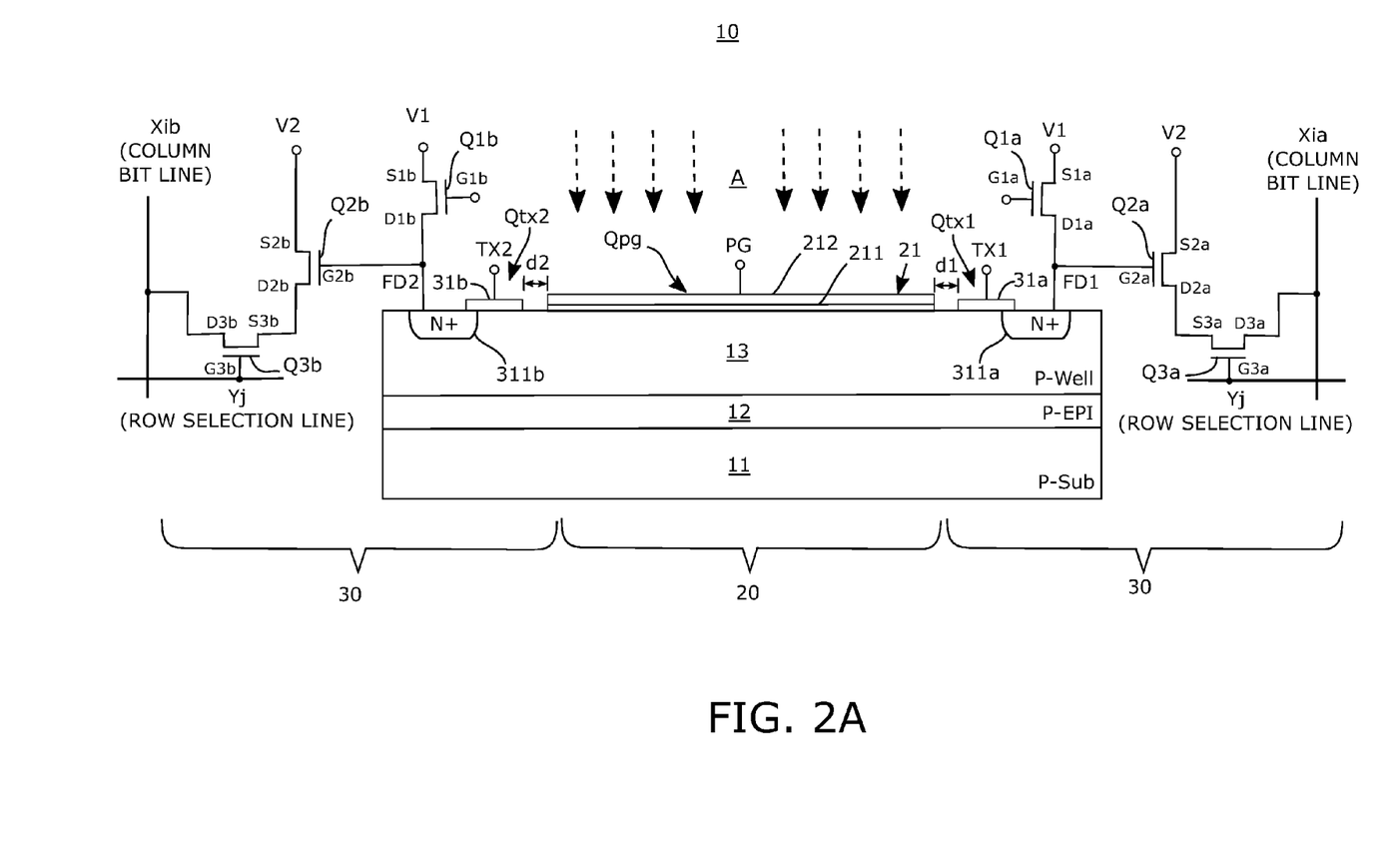
FIG. 2A is a side view in partial section of the CMOS depth sensor element in FIG. 1A.
Figure 3A:
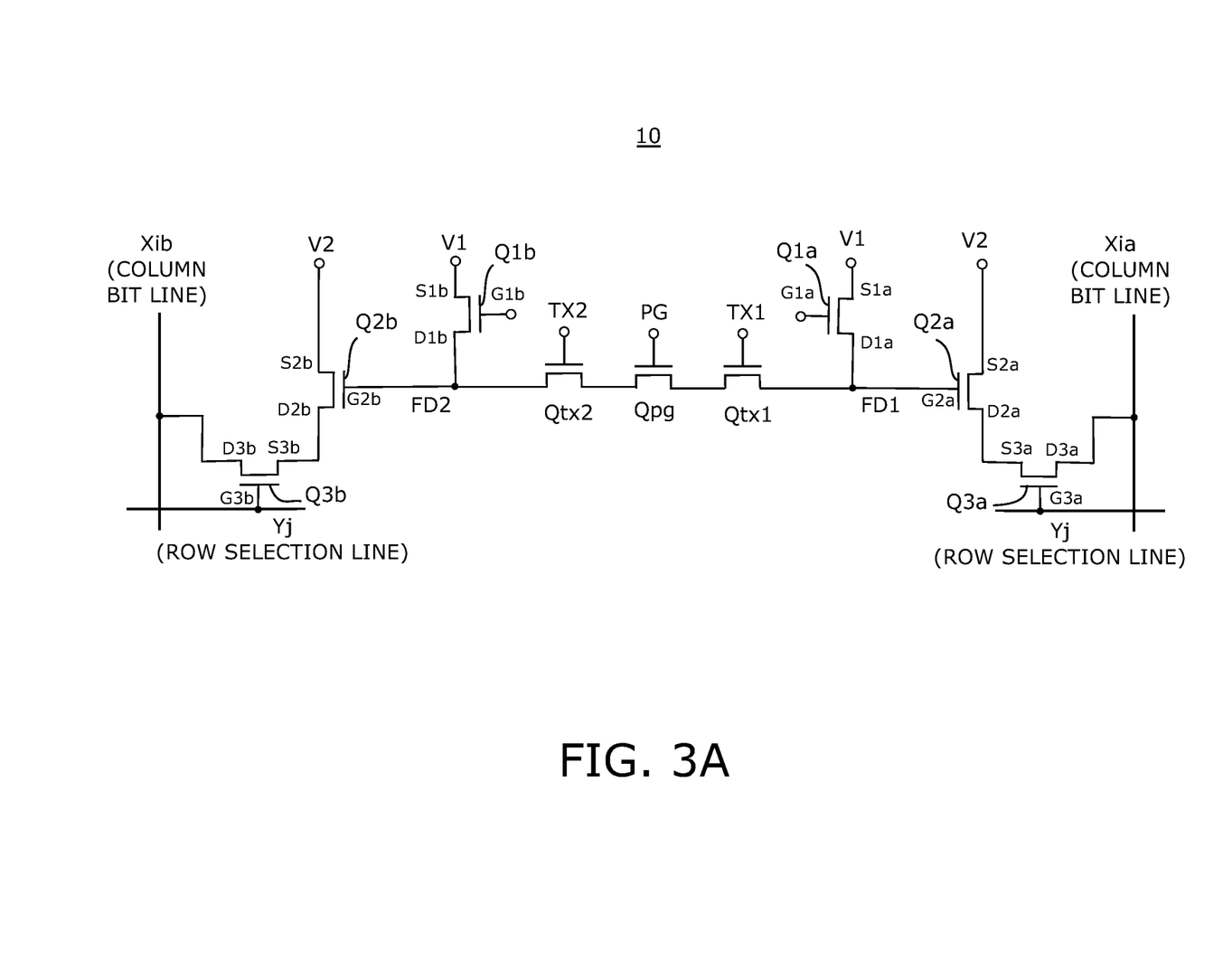
FIG. 3A is a circuit diagram of the CMOS depth sensor elements in FIGS. 1A and 1B.

With reference to FIGS. 1A, 2A and 3A, a first embodiment of a CMOS depth sensor element in accordance with the present invention comprises a sensing element 20 and a reading unit 30. The sensing element 20 comprises a photogate element Qpg. The reading unit 30 comprises a first transfer transistor Qtx1 and a second transfer transistor Qtx2. The sensing element 20 and the reading unit 30 are formed on a substrate 11 and their semiconductor structures are described in detail as following.

The semiconductor structure of the photogate element Qpg comprises a first semiconductor region 13, an insulating layer 211 and a poly-silicon layer 212. The first semiconductor region 13 is formed on the substrate 11 and corresponds to a photosensitive region A. The insulating layer 211 is formed on the first semiconductor region 13. The poly-silicon layer 212 is formed on the insulating layer 211. The insulating layer 211 and the poly-silicon layer 212 constitute a photogate 21 of the photogate element Qpg. The photogate 21 generates majority carriers when the photogate 21 is excited by light. For n-type photogate element, the majority carriers are electrons. For p-type photogate element, the majority carriers are electron holes.

The semiconductor structure of the first transfer transistor Qtx1 comprises a first transfer gate 31a. The semiconductor structure of the second transfer transistor Qtx2 comprises a second transfer gate 31b. The first and second transfer gates 31a, 31b are formed on the first semiconductor region 13. The first transfer gate 31a has a first side and a second side opposite to the first side. The second transfer gate 31b has a first side and a second side opposite to the first side. The second side of the first transfer gate 31a is adjacent to a first side of the photogate 21 of the photogate element Qpg at an interval so that a first gap d1 is formed between the second side of the first transfer gate 31a and the first side of the photogate 21 of the photogate element Qpg. The first side of the second transfer gate 31b is adjacent to a second side of the photogate 21 of the photogate element Qpg at an interval so that a second gap d2 is formed between the first side of the second transfer gate 31b and the second side of the photogate 21 of the photogate element Qpg. In one embodiment, the first gap d1 is equal to the second gap d2. A first floating doped region 311a and a second floating doped region 311b are respectively used as a first transmitting node FD1 and a second transmitting node FD2 and are formed in the first semiconductor region 13. The first floating doped region 311a corresponds to and is connected to the first side of the first transfer gate 31a. The second floating doped region 311b corresponds to and is connected to the second side of the second transfer gate 31b. The first and second floating doped regions 311a, 311b have dopants of a first polarity and the first semiconductor region 13 has dopants of a second polarity opposite to the first polarity. In this embodiment, the substrate 11 is a p-type substrate (P-Sub). The first semiconductor region 13 is a p-type doped well (P-Well) formed in the p-type epitaxy 12 (P-EPI). The first and second floating doped regions 311a, 311b are n$^+$ doped regions. In other embodiments, the substrate 21 may be a n-type substrate. The first semiconductor region 13 may be a n-type doped well. The first and second floating doped regions 311a, 311b may be p$^+$ doped regions.

Those changes are well known in the art and are not described in detail here. In the aforementioned embodiments, comparing to the conventional transfer transistor, at least parts of the first and second transfer gates 31a, 31b of the first and second transfer transistors Qtx1, Qtx2 connect to the same first semiconductor region 13 with the photosensitive gate 21. In addition, the first semiconductor region 13 has dopants of the second polarity and the first and second floating doped regions 311a, 311b have dopants of the first polarity opposite to the second polarity. Thus, the first and second transfer transistors Qtx1, Qtx2 do not have the first n$^+$ doped region 531a of the conventional transfer transistor Qtx as shown in FIG. 6.

With reference to FIG. 2A, the reading unit 30 may further comprise a first and a second reset transistors Q1a, Q1b, a first and a second amplifier transistors Q2a, Q2b and a first and a second selection transistors Q3a, Q3b. In this embodiment, those transistors are n-type metal-oxide-semiconductor field-effect transistors (NMOSFETs) and are represented in electronic element symbols. The sources S1a, S1b of the first and second reset transistors Q1a, Q1b are respectively connected to the first and second transmitting nodes FD1, FD2. The drains D1a, D1b of the first and second reset transistors Q1a, Q1b are connected to a first high potential voltage V1. The gates G2a, G2b of the first and second amplifier transistors Q2a, Q2b are respectively connected to the first and second transmitting nodes FD1, FD2. The drains D2a, D2b of the first and second amplifier transistors Q2a, Q2b are connected to a second high potential voltage V2. The sources S2a, S2b of the first and second amplifier transistors Q2a, Q2b are connected to the drains D3a, D3b of the first and second selection transistors Q3a, Q3b. The gates G3a, G3b of the first and second selection transistors Q3a, Q3b are connected to a corresponding row selection line Yj. The sources S3a, S3b of the first and second selection transistors Q3a, Q3b are respectively connected to corresponding column bit lines Xia, Xib. The electric potentials of the first high potential voltage V1 and the second high potential voltage V2 may be different or the same.

Figure 4:
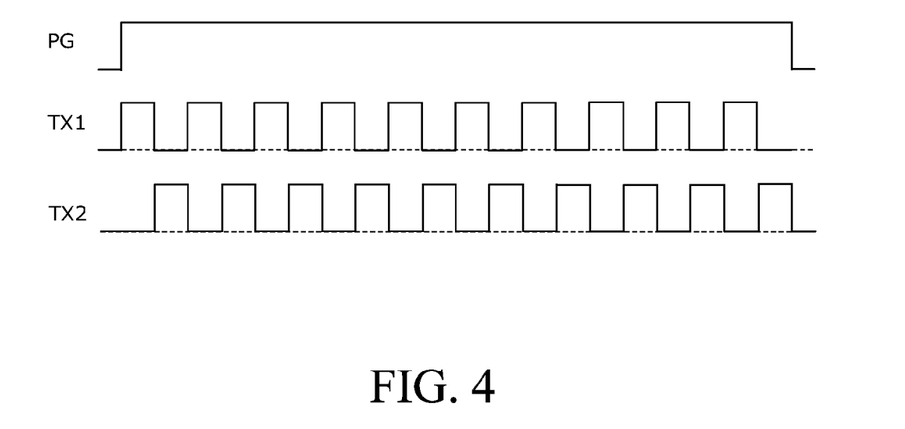
FIG. 4 is a time sequence diagram of the signals in the CMOS depth sensor elements in FIGS. 1A and 1B.

With reference to FIG. 3A, FIG. 3A is an equivalent circuit diagram of a first embodiment of the CMOS depth sensor element 10 as shown in FIG. 2A. When the sensing signals of the photogate element Qpg are read as shown in FIG. 4, a high electric potential signal PG is supplied to the photogate 21 and a first and second driving signals TX1, TX2 (square wave) are respectively supplied to the first and second transfer gates 31a, 31b of the first and second transfer transistors Qtx1, Qtx2. Since the first driving signal TX1 is a reverse signal of the second driving signal TX2, the electric fields are respectively established between the photogate 21 and the first or second transfer gates 31a, 31b. By the fringing electric field effect, the majority carriers of the generated from the photogate 21 excited by the lights are transferred to the first or second floating doped regions 311a, 311b to accelerate the outputting speed of the sensing signals. For a part of the high electric potential signal PG corresponds to the first transfer gate 311a that is simultaneously at high electric potential so that the majority carriers are transferred to the first transmitting node FD1. At this time, the gate G1a of the first reset transistor Q1a is not switched on due to low electric potential so that the first amplifier transistor Q2a is switched on to amplify the sensing signals corresponding to the majority carriers collected in the fist transmitting node FD1. When a selection signal is transmitted to the row selection line Yj connecting to the gate G3a of the first selection transistor Q3a, the first selection transistor Q3a is switched on to transmit the amplified sensing signals to the corresponding column bit line Xia. For another part of the high electric potential signal PG corresponds to the second transfer gate 311b that is simultaneously at high electric potential so that the majority carriers are transferred to the second transmitting node FD2. At that time, the gate G1b of the second reset transistor Q1b is not switched on due to low electric potential so that the second amplifier transistor Q2b is switched on to amplify the sensing signals corresponding to the majority carriers collected in the second transmitting node FD2. When a selection signal is transmitted to the row selection line Yj connecting to the gate G3b of the second selection transistor Q3b, the second selection transistor Q3b is switched on to transmit the amplified sensing signals to the corresponding column bit line Xib.

The gaps d1, d2 must be sufficient to establish electric fields for forming the fringing electric field effect between the photogate 21 and the first or second transfer gates 311a, 311b when the first and second driving signals TX1, TX2 are at high electric potential. In this embodiment, each gap is 0.22 micrometer. If the highest supplied voltage to the photogate 21 is 3.3V, each gap may be between 0.01 to 0.22 micrometer, but is not limited to that. Further, when the voltage supplied to the photogate 21 is higher, each gap may be larger, such as 0.01 to 0.4 micrometer.

Figure 1B:
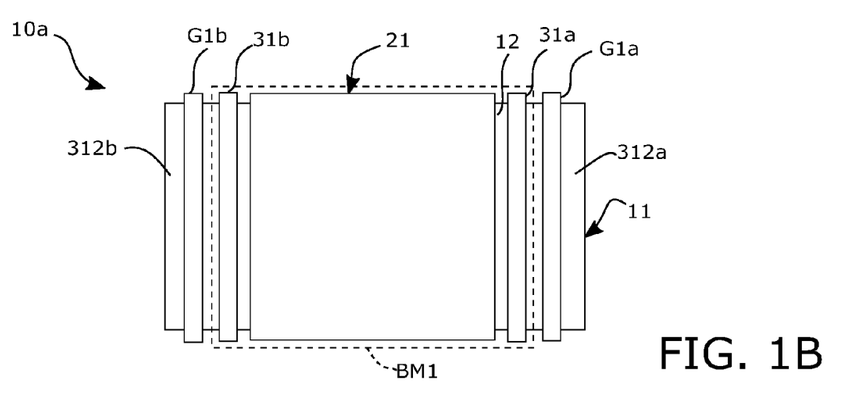
FIG. 1B is a top view of a second embodiment of a CMOS depth sensor element in accordance with the present invention.
Figure 2B:
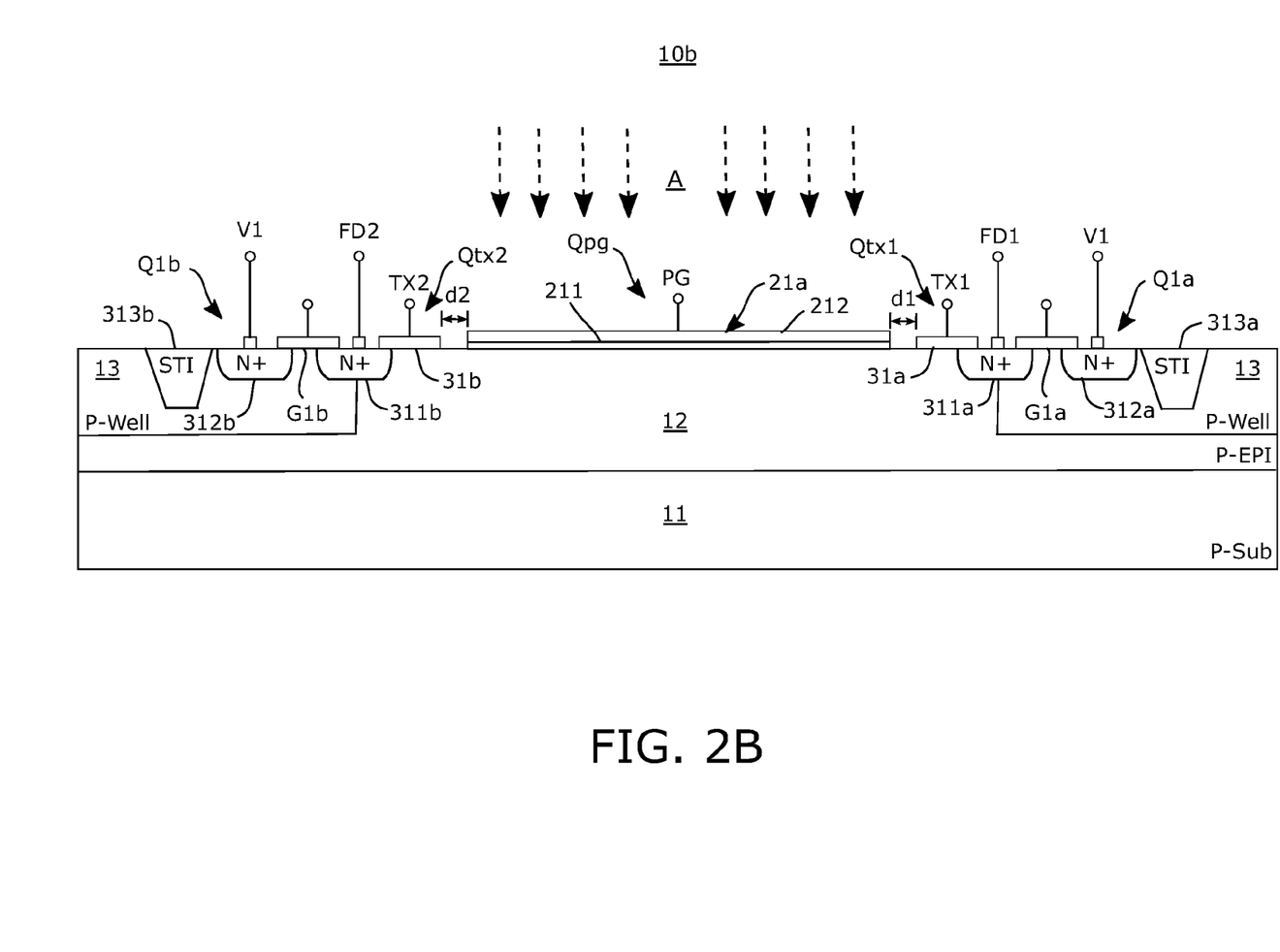
FIG. 2B is a side view in partial section of the CMOS depth sensor element in FIG. 1B.

With reference to FIGS. 1B and 2B, a second embodiment of a CMOS depth sensor element 10a in accordance with the present invention is similar to the first embodiment. However, when the p-type doped well is formed, a shielding mask BM1 is used to block a part of the second semiconductor region 12 (p-type epitaxy) so that the p-type doped well is not formed on this part of the second semiconductor region 12. Thus, the photogate 21a of the photogate element Qpg, the first and second transfer gates 31a, 31b, and part of the first and second floating doped regions 311a, 311b does not have p-type doped well formed under them but directly connect to the p-type epitaxy (P-EPI) to generate more majority carriers. Therefore, the photogate 21a and the first and second transfer gates 31a, 31b shares the same second semiconductor region 12. Other parts of the p-type doped well (P-Well) are reserved for other electric elements of the reading unit 30 to be formed thereon. As shown in FIG. 2B, the a first and second drain/source doped regions 312a, 312b of the first and second reset transistors Q1a, Q1b are formed in the p-type doped well. A first and second gates G1a, G1b are formed on the p-type doped well. Two sides of the first gate G1a are respectively connected to the first floating doped region 311a and the first drain-source doped region 312a. Two sides of the second gate G1b are respectively connected to the second floating doped region 311b and the second drain/source doped region 312b. A first and second trench isolating regions 313a, 313b are formed in the p-type doped well and respectively adjacent to another side of the first and second drain/source doped regions 312a, 312b. The first and second drain/source doped regions 312a, 312b have dopants of the first polarity and the second semiconductor region 12 has dopants of the second polarity opposite to the first polarity. In this embodiment, since the second semiconductor region 12 is a p-type epitaxy, the first and second drain/source doped regions 312a, 312b are n-type doped regions.

Figure 1C:
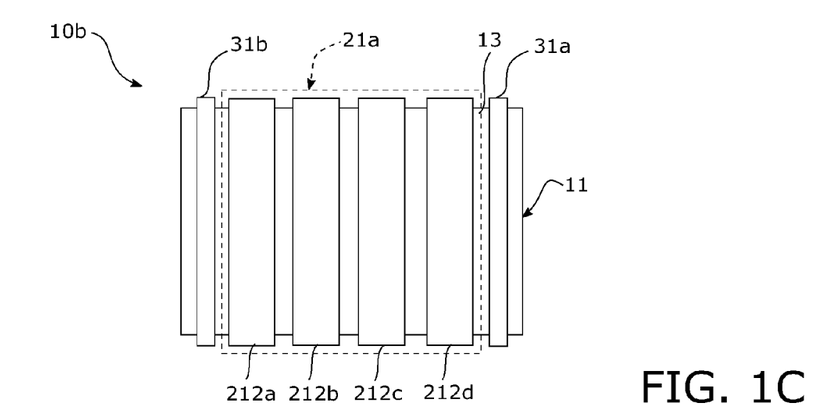
FIG. 1C is a top view of a third embodiment of a CMOS depth sensor element in accordance with the present invention.
Figure 2C:
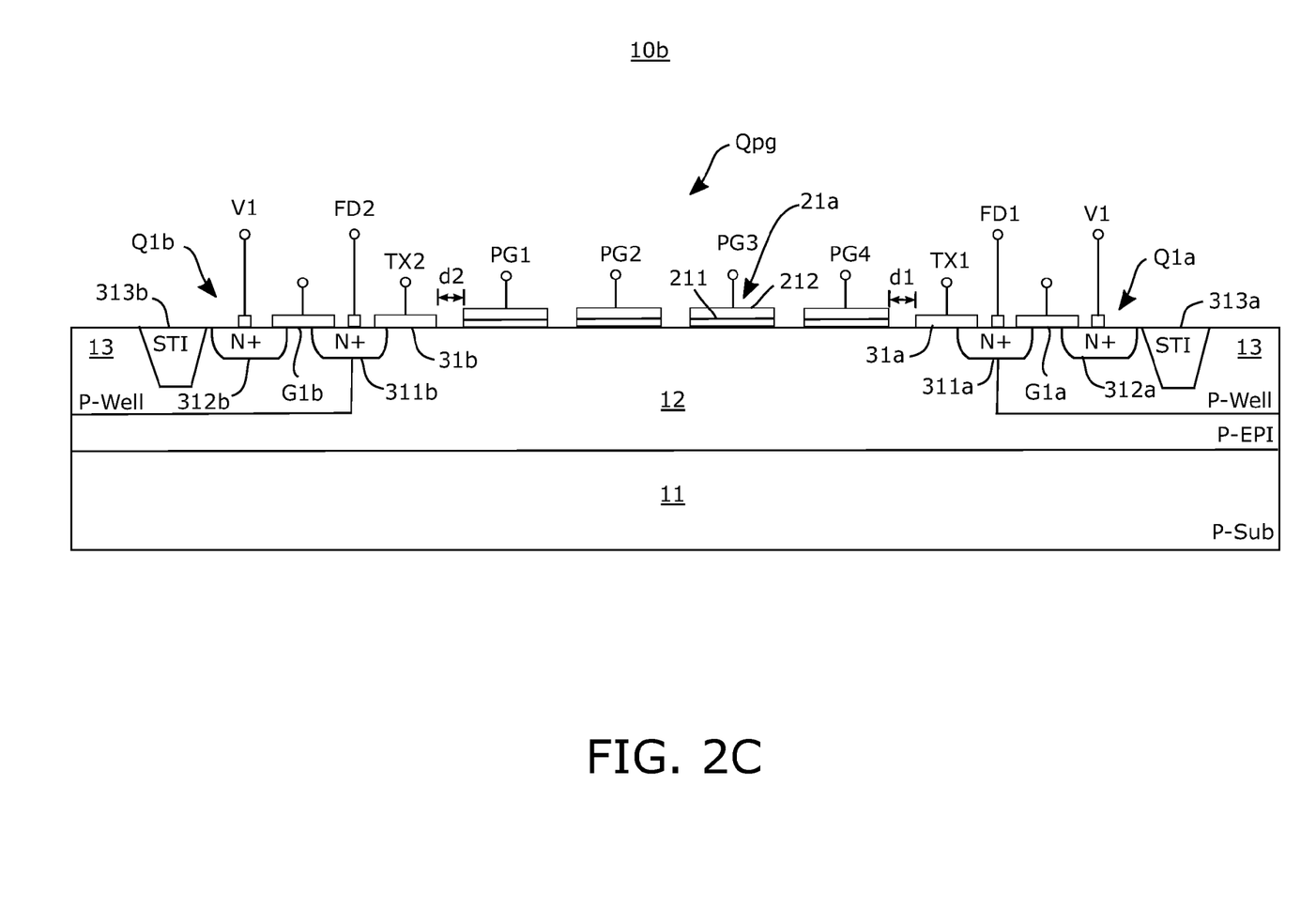
FIG. 2C is a side view in partial section of the CMOS depth sensor element in FIG. 1C.

With reference to FIGS. 1C and 2C, a third embodiment of the CMOS depth sensor element 10b in accordance with the present invention is similar to the second embodiment. However, the photogate 21a of the photogate element Qpg comprises multiple sub-photogates 212a~212d arranged in parallel. The amount of the sub-photogates 212a~212d is not limited and the areas of the sub-photogates 212a~212d may be the same or different.

Figure 3B:
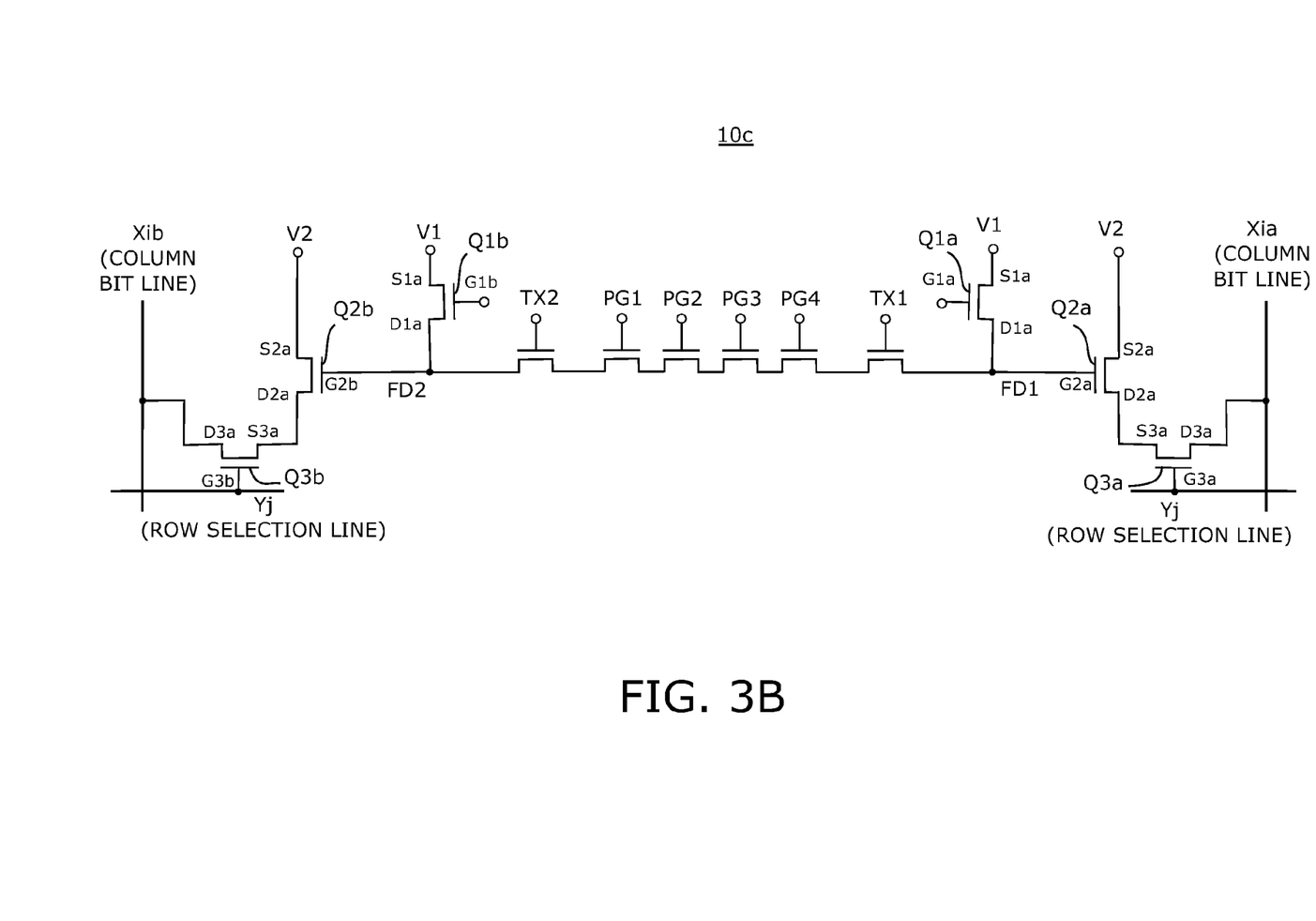
FIG. 3B is a circuit diagram of the CMOS depth sensor element in FIG. 1C.
Figure 5A:
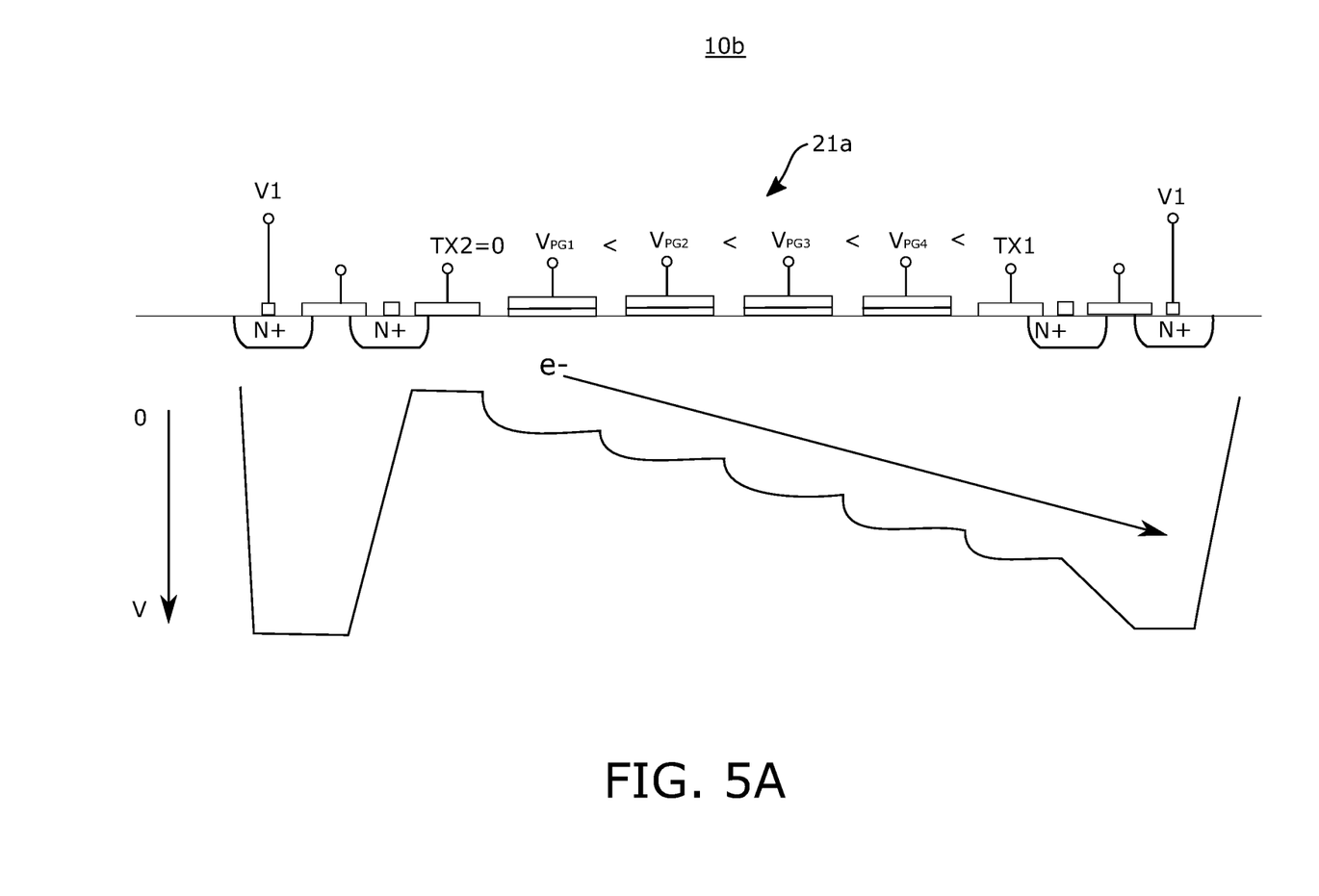
FIG. 5A is an energy level diagram of the potential energy of the CMOS depth sensor element in FIG. 1C during the first time phase.

With further reference to FIGS. 3B and 5A, when the sensing signals corresponding to the majority carriers of the first transmitting node FD1 are read at first time phase, the first driving signal TX1 is supplied to the first transfer gate 31a as shown in FIG. 4. At this time, the first transfer gate 31a is at high electric potential. In addition, to speed up the transferring speed of the majority carriers, multiple high electric potential signals with different electric potentials are respectively supplied simultaneously to the sub-photogates 212a~212d. As shown in FIG. 5A, the electric potentials of the high electric potential signals $V_{PG1} \sim V_{PG4}$ are gradually decreased from the first transfer gate 31a toward the second transfer gate 31b. The electric potential of the first driving signal TX1 is higher than the high electric potential signals $V_{PG1} \sim V_{PG4}$. At the same time, the second driving signal TX2 is not supplied to the second transfer gate 31b so that the electric potential of the second transfer gate 31b is zero.

Figure 5B:
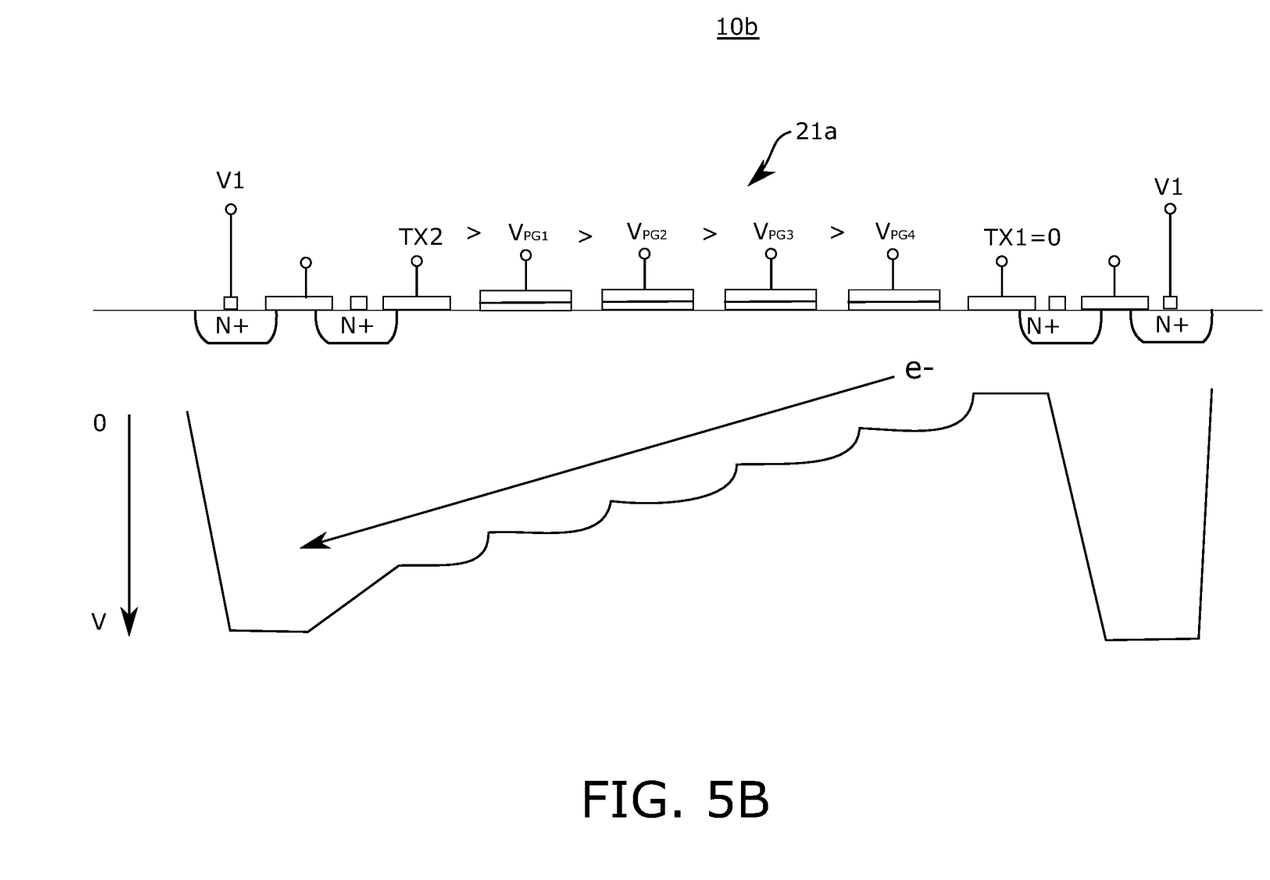
FIG. 5B is an energy level diagram of the potential energy of the CMOS depth sensor element in FIG. 1C during the second time phase.

With further reference to FIGS. 3B and 5B, when the sensing signals corresponding to the majority carriers of the second transmitting node FD2 are read at second time phase, the second driving signal TX2 is supplied to the second transfer gate 31b as shown in FIG. 4. At this time, the second transfer gate 31b is at high electric potential. In addition, the multiple high electric potential signals with different electric potentials are respectively supplied simultaneously to the sub-photogates 212a~212d. The electric potentials of the high electric potential signals $V_{PG1} \sim V_{PG4}$ are gradually increased from the first transfer gate 31a toward the second transfer gate 31b. The electric potential of the second driving signal TX2 is higher than the high electric potential signals $V_{PG1} \sim V_{PG4}$. At the same time, the first driving signal TX1 is not supplied to the first transfer gate 31a so that the electric potential of the first transfer gate 31a is zero.

With the aforementioned semiconductor structure of the CMOS depth sensor element, the first and second floating doped regions are used as transmitting nodes, and the photogate and at least parts of the first and the second transfer gates connect to the same semiconductor regions, and the polarities of the dopants of the semiconductor region and the first and second floating doped regions are different. Therefore, the CMOS depth sensor element of the present invention does not comprise the first doped region of the transfer transistor of the conventional CMOS depth sensor element. Thus, when the first or second transfer gates are supplied the driving signals to read the sensing signals of the CMOS depth sensor element of the present invention, an electric field is established between the photogate and the first or second transfer gates supplied the driving signals to result in a fringing electric field effect. Then the majority carriers from the photogate element excited by lights drift to the first or second floating doped regions to speed up the outputting speed of the sensing signals.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A depth sensor element comprising:
   a substrate comprising a photosensitive region;
   a semiconductor region formed on the substrate;
   a photogate formed on the semiconductor region, corresponding to the photosensitive region and having a first side and a second side;
   a first transfer gate formed on the semiconductor region and having
      a first side; and
      a second side adjacent to the first side of the photogate;
   a first gap formed between the second side of the first transfer gate and the first side of the photogate;
   a second transfer gate formed on the semiconductor region and having
      a first side adjacent to the second side of the photogate; and
      a second side;
   a second gap formed between the first side of the second transfer gate and the second side of the photogate;
   a first floating doped region formed in the semiconductor region, connected to the first side of the first transfer gate and being as a first transmitting node; and
   a second floating doped region formed in the semiconductor region, connected to the second side of the second transfer gate and being as a second transmitting node;
   wherein the photogate, at least a part of the first transfer gate, at least a part of the second transfer gate connect to the same semiconductor region, and the first and second floating doped regions have dopants of a first polarity and the semiconductor region has dopants of a second polarity opposite to the first polarity.

2. The depth sensor element as claimed in claim 1 further comprising:
   a first reset transistor comprising a first gate and a first drain/source doped region, wherein two sides of the first gate are respectively connected to the first floating doped region and the first drain/source doped region;
   a second reset transistor comprising a second gate and a second drain/source doped region, wherein two sides of the second gate are respectively connected to the second floating doped region and the second drain/source doped region;
   a first trench isolating region, wherein two sides of the first drain/source doped region respectively correspond to the first gate and the first trench isolating region;
   a second trench isolating region, wherein two sides of the second drain/source doped region respectively correspond to the second gate and the second trench isolating region;
   wherein the first and second drain/source doped regions have dopants of the first polarity and the semiconductor region has dopants of the second polarity opposite to the first polarity.

3. The depth sensor element as claimed in claim 2, wherein an epitaxy is formed on the substrate and the semiconductor region is formed in the epitaxy.

4. The depth sensor element as claimed in claim 2, wherein
   the semiconductor region is an epitaxy;
   a doped well is formed in the epitaxy and corresponds to the first and second gates; and
   the first and second drain/source doped regions and the first trench isolating region are formed in the doped well.

5. The depth sensor element as claimed in claim 3, wherein the substrate is a p-type substrate;
   the epitaxy is a p-type epitaxy;
   the first and second floating doped regions are n-type doped regions; and
   the first and second drain/source doped regions are n-type doped regions.

6. The depth sensor element as claimed in claim 4, wherein
   the substrate is a p-type substrate;
   the epitaxy is a p-type epitaxy;
   the doped well is a p-type doped well;
   the first and second floating doped regions are n-type doped regions; and
   the first and second drain/source doped regions are n-type doped regions.

7. The depth sensor element as claimed in claim 2 further comprising:
two amplifier transistors, and each amplifier transistor having a gate, and the two gates of the amplifier transistors respectively coupled to the first and second floating doped regions; and
two selection transistors, and each selection transistor coupling to a corresponding amplifier transistor, a column bit line and a row selection line.

8. The depth sensor element as claimed in claim 3 further comprising:
two amplifier transistors, and each amplifier transistor having a gate, and the two gates of the amplifier transistors respectively coupled to the first and second floating doped regions; and
two selection transistors, and each selection transistor coupling to a corresponding amplifier transistor, a column bit line and a row selection line.

9. The depth sensor element as claimed in claim 4 further comprising:
two amplifier transistors, and each amplifier transistor having a gate, and the two gates of the amplifier transistors respectively coupled to the first and second floating doped regions; and
two selection transistors, and each selection transistor coupling to a corresponding amplifier transistor, a column bit line and a row selection line.

10. The depth sensor element as claimed in claim 5 further comprising:
two amplifier transistors, and each amplifier transistor having a gate, and the two gates of the amplifier transistors respectively coupled to the first and second floating doped regions; and
two selection transistors, and each selection transistor coupling to a corresponding amplifier transistor, a column bit line and a row selection line.

11. The depth sensor element as claimed in claim 6 further comprising:
two amplifier transistors, and each amplifier transistor having a gate, and the two gates of the amplifier transistors respectively coupled to the first and second floating doped regions; and
two selection transistors, and each selection transistor coupling to a corresponding amplifier transistor, a column bit line and a row selection line.

12. The depth sensor element as claimed in claim 1, wherein
the photogate has multiple sub-photogates arranged in parallel, wherein
at a first time phase, from the first transfer gate to the second transfer gate, the first transfer gate and the sub-photogates are supplied descending voltages; and
at a second time phase, form the second transfer gate to the first transfer gate, the second transfer gate and the sub-photogates are supplied descending voltages.

13. The depth sensor element as claimed in claim 12, wherein the sub-photogates have the same area.

14. The depth sensor element as claimed in claim 12, wherein the sub-photogates have different areas.

15. The depth sensor element as claimed in claim 2, wherein
the photogate has multiple sub-photogates arranged in parallel, wherein
at a first time phase, from the first transfer gate to the second transfer gate, the first transfer gate and the sub-photogates are supplied descending voltages; and
at a second time phase, form the second transfer gate to the first transfer gate, the second transfer gate and the sub-photogates are supplied descending voltages.

16. The depth sensor element as claimed in claim 15, wherein the sub-photogates have the same area.

17. The depth sensor element as claimed in claim 15, wherein the sub-photogates have different areas.

18. The depth sensor element as claimed in claim 1, wherein the first and second gap is between 0.01 micrometer to 0.4 micrometer.

19. A sensing method of a depth sensor element, wherein the depth sensor element has a photogate, a first transfer gate and a second transfer gate, and the first and second transfer gates are formed on two sides of the photogate, and the photogate has multiple sub-photogates, the method comprises acts of:
at a first time phase, from the first transfer gate to the second transfer gate, the first transfer gate and the sub-photogates are supplied descending voltages; and
at a second time phase, form the second transfer gate to the first transfer gate, the second transfer gate and the sub-photogates are supplied descending voltages.

* * * * *